United States Patent
Lim et al.

(10) Patent No.: US 11,710,733 B2
(45) Date of Patent: Jul. 25, 2023

(54) VERTICAL POWER GRID STANDARD CELL ARCHITECTURE

(71) Applicant: QUALCOMM Incorporated, San Diego, CA (US)

(72) Inventors: Hyeokjin Lim, San Diego, CA (US); Bharani Chava, Cork City (IE); Foua Vang, Sacramento, CA (US); Seung Hyuk Kang, San Diego, CA (US); Venugopal Boynapalli, San Marcos, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 443 days.

(21) Appl. No.: 16/808,336

(22) Filed: Mar. 3, 2020

(65) Prior Publication Data

US 2021/0280571 A1    Sep. 9, 2021

(51) Int. Cl.
*H01L 27/02* (2006.01)
*H03K 19/0185* (2006.01)
*H01L 23/528* (2006.01)

(52) U.S. Cl.
CPC ........ *H01L 27/0207* (2013.01); *H01L 23/528* (2013.01); *H03K 19/018557* (2013.01)

(58) Field of Classification Search
CPC .............. H01L 27/0207; H01L 23/528; H03K 19/018557
See application file for complete search history.

(56) References Cited

U.S. PATENT DOCUMENTS

| | | | | |
|---|---|---|---|---|
| 7,509,613 | B2 * | 3/2009 | Frenkil | G06F 30/39 716/120 |
| 8,742,464 | B2 * | 6/2014 | Sherlekar | H01L 27/0207 257/203 |
| 9,070,552 | B1 * | 6/2015 | Shah | H01L 27/0207 |
| 9,094,011 | B2 * | 7/2015 | Koog | H03K 17/161 |
| 9,786,685 | B2 * | 10/2017 | Lee | H01L 27/11807 |
| 9,887,209 | B2 * | 2/2018 | Gupta | H01L 23/535 |
| 10,128,189 | B2 * | 11/2018 | Zohrabyan | H01L 21/4846 |
| 10,141,336 | B2 * | 11/2018 | Lee | H01L 27/0207 |

(Continued)

*Primary Examiner* — Mounir S Amer
*Assistant Examiner* — Alexander Belousov
(74) *Attorney, Agent, or Firm* — Procopio, Cory, Hargreaves & Savitch LLP

(57) ABSTRACT

A MOS IC logic cell includes a plurality of gate interconnects extending on tracks in a first direction. The logic cell includes intra-cell routing interconnects coupled to at least a subset of the gate interconnects. The intra-cell routing interconnects include intra-cell Mx layer interconnects on an Mx layer extending in the first direction. The Mx layer is a lowest metal layer for PG extending in the first direction. The intra-cell Mx layer interconnects extend in the first direction over at least a subset of the tracks excluding every $m^{th}$ track, where $2 \leq m < P_{PG}$ and $P_{PG}$ is a PG grid pitch. A MOS IC may include at least one MOS IC logic cell, and may further include a first set of PG Mx layer interconnects extending in the first direction over the at least one logic cell. The first set of PG Mx layer interconnects have the pitch $P_{PG} > m*P$.

12 Claims, 9 Drawing Sheets

(56) References Cited

U.S. PATENT DOCUMENTS

| | | | |
|---|---|---|---|
| 10,622,307 B2* | 4/2020 | Kim | H01L 23/528 |
| 10,680,015 B2* | 6/2020 | Lee | H01L 27/0207 |
| 10,977,407 B2* | 4/2021 | Lee | G06F 30/398 |
| 11,303,274 B1* | 4/2022 | Takashima | H03K 19/20 |
| 2006/0114025 A1* | 6/2006 | Frenkil | G06F 30/39 |
| | | | 326/35 |
| 2007/0168899 A1* | 7/2007 | Frenkil | G06F 30/39 |
| | | | 257/773 |
| 2013/0026572 A1* | 1/2013 | Kawa | H01L 29/0649 |
| | | | 257/E21.602 |
| 2018/0314785 A1* | 11/2018 | Schultz | H01L 27/11807 |
| 2020/0365589 A1* | 11/2020 | Liaw | H01L 27/0207 |
| 2021/0280571 A1* | 9/2021 | Lim | H01L 23/5286 |

* cited by examiner

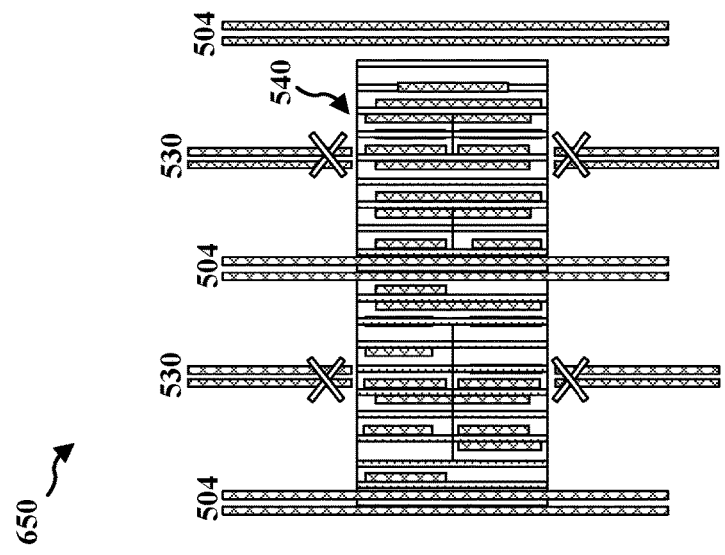
FIG. 6B
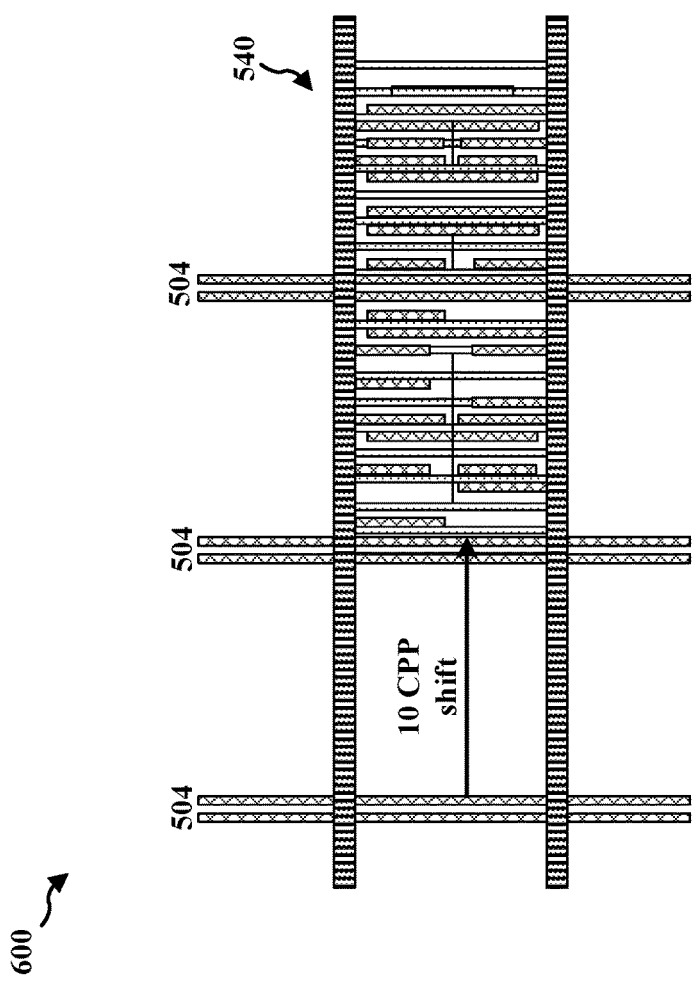
FIG. 6A
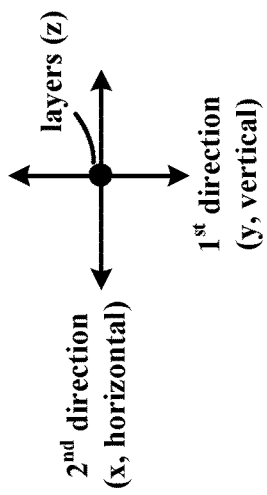

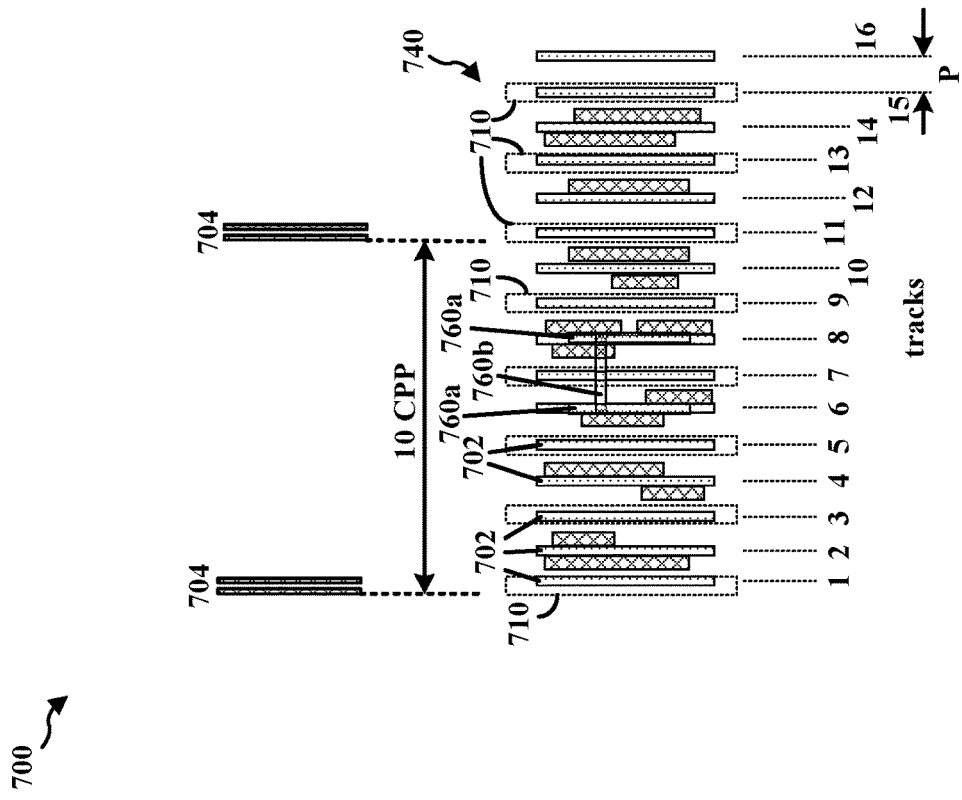
FIG. 7A
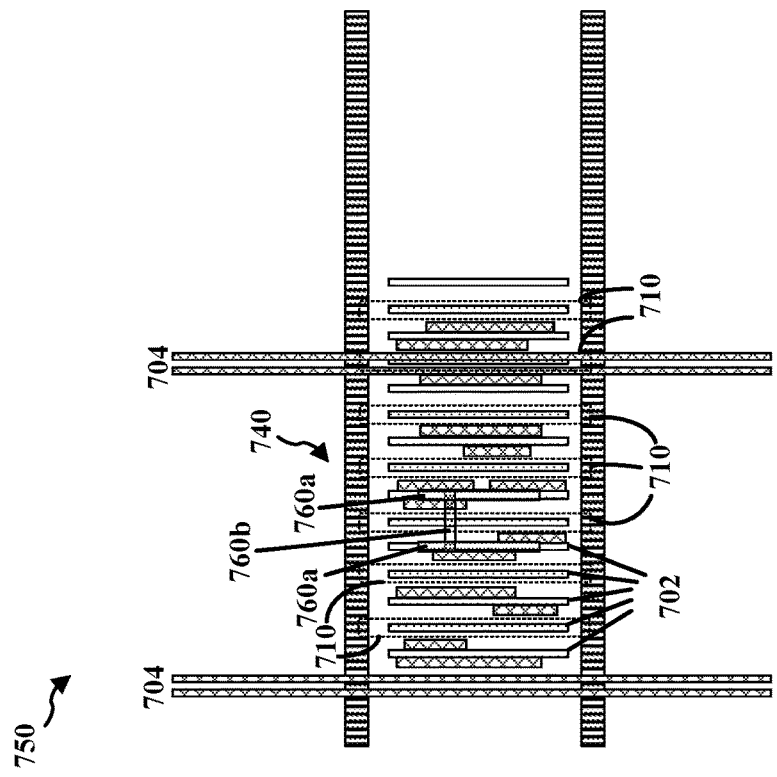
FIG. 7B
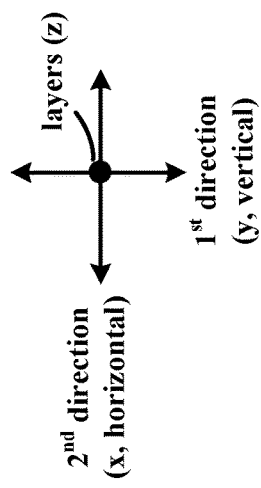

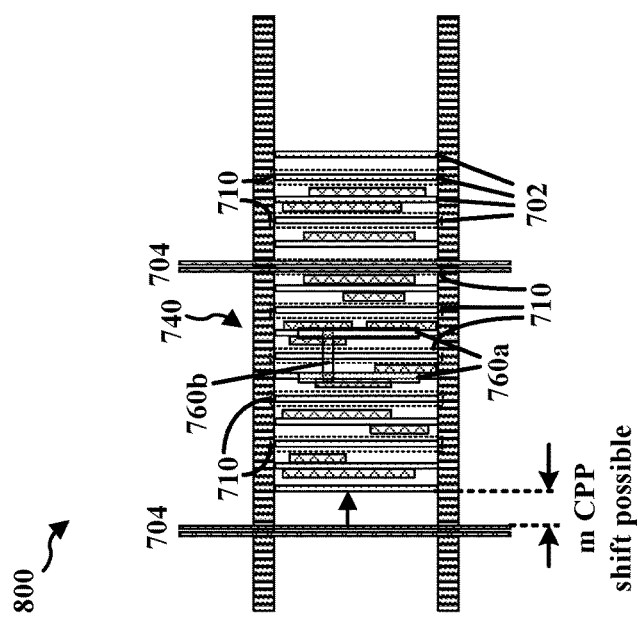
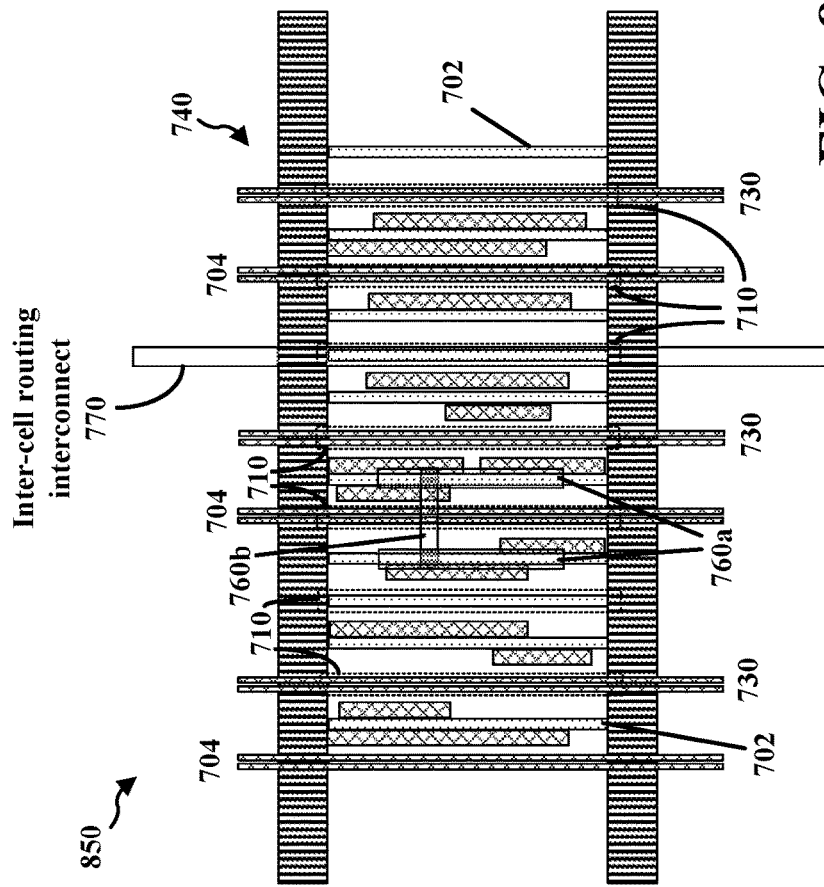
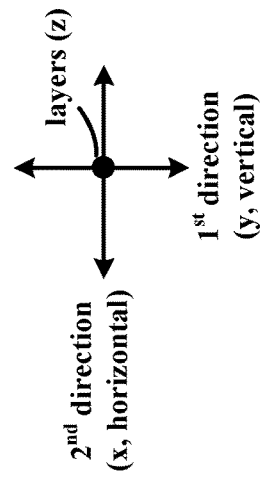
FIG. 8A
FIG. 8B

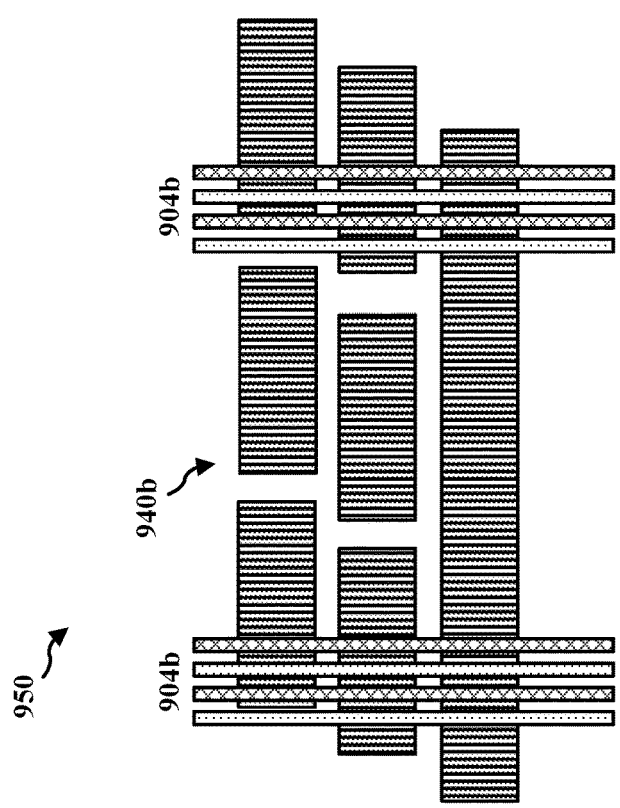
FIG. 9A
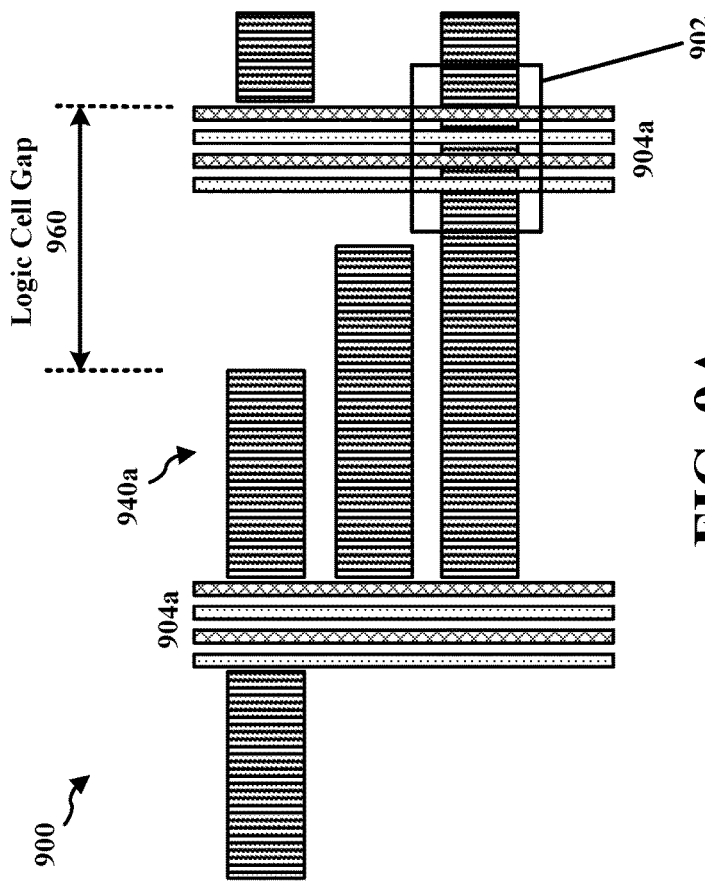
FIG. 9B
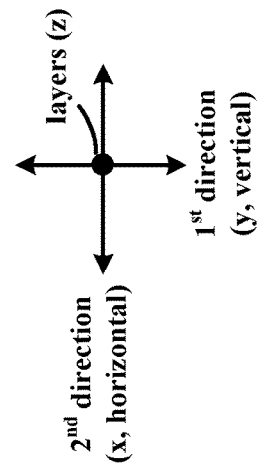

VERTICAL POWER GRID STANDARD CELL ARCHITECTURE

BACKGROUND

Field

The present disclosure relates generally to a cell architecture, and more particularly, to a vertical power grid standard cell architecture.

Background

A standard cell device is an integrated circuit (IC) that implements digital logic. Such standard cell device may be reused multiple times within an application-specific IC (ASIC). An ASIC, such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or fin FETs (FinFETs)) and connect the transistors into circuits.

An ASIC may include a power grid. The power grid may include both horizontally extending interconnects and vertically extending interconnects that form a crossing pattern, where the vertically extending interconnects cross the horizontally extending interconnects on different layers. The vertically extending interconnects may be spaced apart by a particular pitch. Cells that are wider than the pitch may have little flexibility in placement. There is currently a need for a cell architecture that allows for more flexible placement with respect to the ASIC power grid.

SUMMARY

In an aspect of the disclosure, a metal oxide semiconductor (MOS) IC logic cell includes a plurality of gate interconnects extending on tracks in a first direction. In addition, the MOS IC logic cell includes intra-cell routing interconnects coupled to at least a subset of the gate interconnects. The intra-cell routing interconnects include intra-cell metal x (Mx) layer interconnects on an Mx layer extending in the first direction. The Mx layer is a lowest metal layer for power and ground (PG) and extends in the first direction. the intra-cell Mx layer interconnects extend in the first direction over at least a subset of the tracks excluding every $m^{th}$ track, where m is an integer greater than or equal to 2 and less than $P_{PG}$, and $P_{PG}$ is a PG grid pitch.

In an aspect of the disclosure, a MOS IC includes at least one logic cell. Each logic cell of the at least one logic cell includes a plurality of gate interconnects extending on tracks in a first direction with a pitch P, and intra-cell routing interconnects coupled to at least a subset of the gate interconnects. The intra-cell routing interconnects include intra-cell Mx layer interconnects on an Mx layer extending in the first direction. The Mx layer is a lowest metal layer for PG and extends in the first direction. The intra-cell Mx layer interconnects extend in the first direction over at least a subset of the tracks excluding every $m^{th}$ track, where m is an integer greater than or equal to 2 and less than $P_{PG}$, and $P_{PG}$ is a PG grid pitch. The MOS IC further includes a first set of PG Mx layer interconnects extending in the first direction over the at least one logic cell. The first set of PG Mx layer interconnects have the pitch $P_{PG}$ that is greater than m*P.

BRIEF DESCRIPTION OF THE DRAWINGS

FIG. 6A and FIG. 6B are diagrams conceptually illustrating cell placement and PG density based on the first standard cell architecture.

FIG. 7A and FIG. 7B are diagrams conceptually illustrating a second standard cell architecture, and cell placement based on the second standard cell architecture.

FIG. 8A and FIG. 8B are diagrams conceptually illustrating cell placement and PG density based on the second standard cell architecture.

FIG. 9A and FIG. 9B are diagrams conceptually illustrating cell placement based on the first and second standard cell architectures, respectively.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
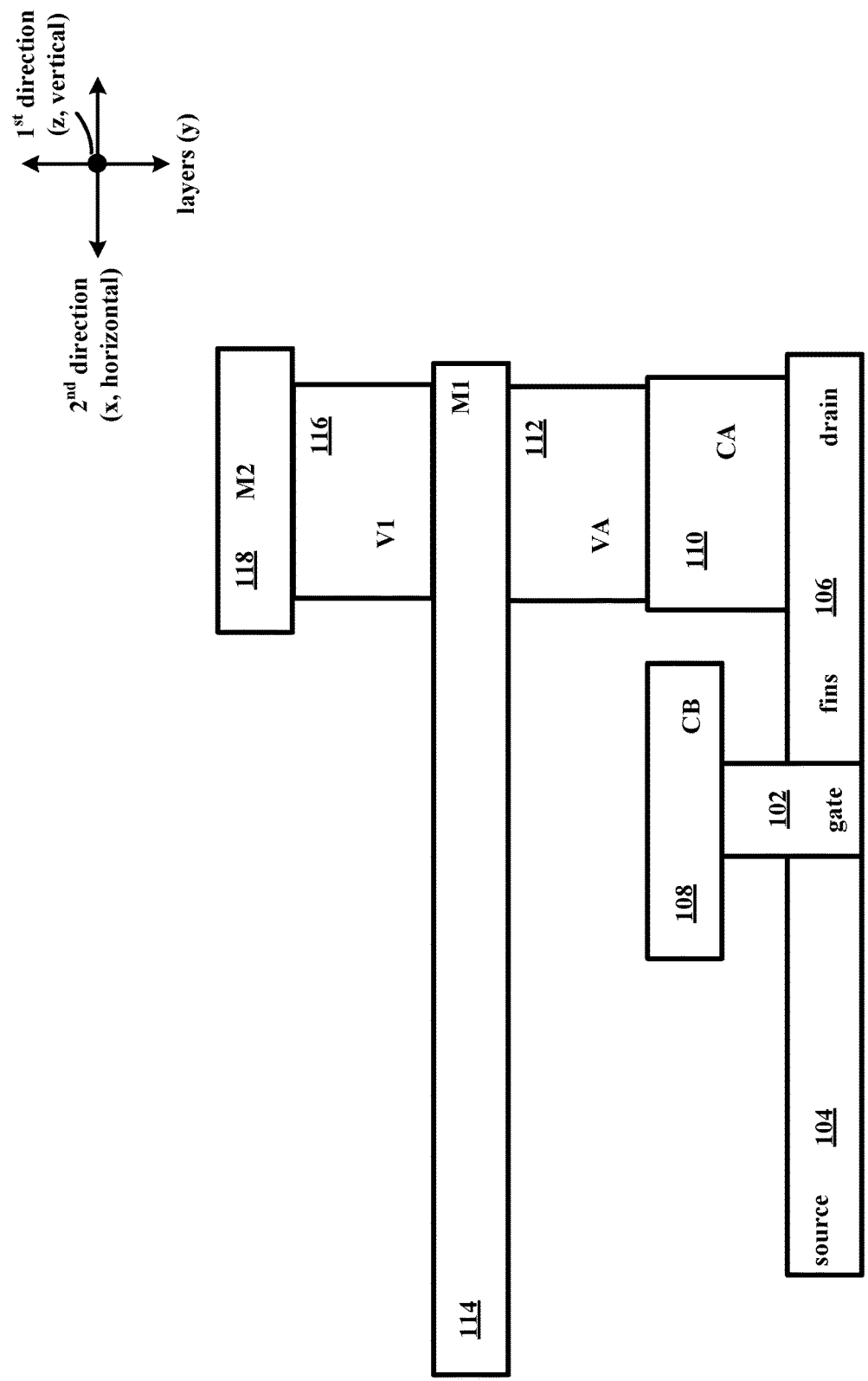
FIG. 1 is a first diagram illustrating a side view of various layers within a standard cell and IC.

FIG. 1 is a first diagram 100 illustrating a side view of various layers within a standard cell and IC. The various layers change in the y direction. As illustrated in FIG. 1, a transistor has a gate 102 (which may be referred to as POLY even though the gate may be formed of metal, polysilicon, or a combination of polysilicon and metal), a source 104, and a drain 106. The source 104 and the drain 106 may be formed by fins. The gate 102 may extend in a first direction (e.g., vertical direction along the z axis coming out of the page), and the fins may extend in a second direction orthogonal to the first direction (e.g., horizontal direction along the x axis). A contact B (CB) layer interconnect 108 (also referred to as a metal POLY (MP) layer interconnect) may contact the gate 102. A contact A (CA) layer interconnect 110 (also referred to as a metal diffusion (MD) layer interconnect) may contact the source 104 and/or the drain 106. A via 112 (which may be referred to as via A (VA)) may contact the CA layer interconnect 110. A metal 1 (M1) layer interconnect 114 may contact the via VA 112. The M1 layer interconnect 114 may extend in the second direction only (i.e., unidirectional in the second direction). A via V1 116 may contact the M1 layer interconnect 114. A metal 2 (M2) layer interconnect 118 may contact the via V1 116. The M2 layer interconnect 118 may extend in the first direction only (i.e., unidirectional in the first direction). The M2 layer is a lowest vertical layer. Specifically, the M2 layer may be unidirectional in the vertical direction, and is the closest vertically unidirectional layer to the silicon substrate. Higher layers include a via layer including vias V2 and a metal 3 (M3) layer including M3 layer interconnects. The M3 layer interconnects may extend in the second direction.

Figure 2:
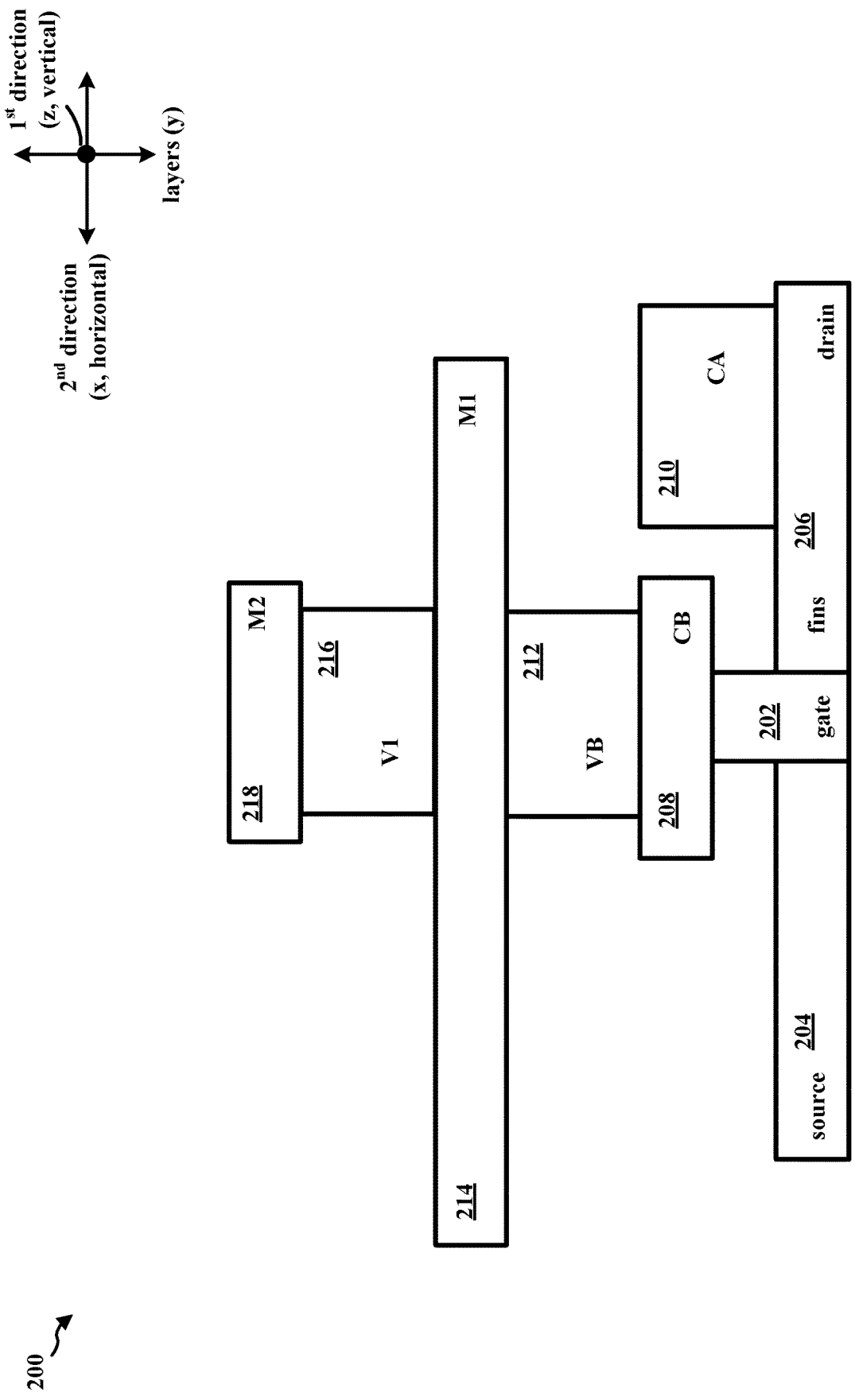
FIG. 2 is a second diagram illustrating a side view of various layers within a standard cell and IC.

FIG. 2 is a second diagram 200 illustrating a side view of various layers within a standard cell and IC. The various layers change in the y direction. As illustrated in FIG. 2, a transistor has a gate 202, a source 204, and a drain 206. The source 204 and the drain 206 may be formed by fins. The gate 202 may extend in a first direction (e.g., vertical direction along the z axis coming out of the page), and the fins may extend in a second direction orthogonal to the first direction (e.g., horizontal direction along the x axis). A CB layer interconnect 208 may contact the gate 202. A CA layer interconnect 210 may contact the source 204 and/or the drain 206. A via 212 (which may be referred to as via B (VB)) may contact the CB layer interconnect 208. An M1 layer interconnect 214 may contact the via VB 212. The M1 layer interconnect 214 may extend in the second direction only (i.e., unidirectional in the second direction). A via V1 216 may contact the M1 layer interconnect 214. An M2 layer interconnect 218 may contact the via V1 216. The M2 layer interconnect 218 may extend in the first direction only (i.e., unidirectional in the first direction). The M2 layer is a lowest vertical layer. Specifically, the M2 layer may be unidirectional in the vertical direction, and is the closest vertically unidirectional layer to the silicon substrate. Higher layers include a via layer including vias V2 and an M3 layer including M3 layer interconnects. The M3 layer interconnects may extend in the second direction.

Figure 3:
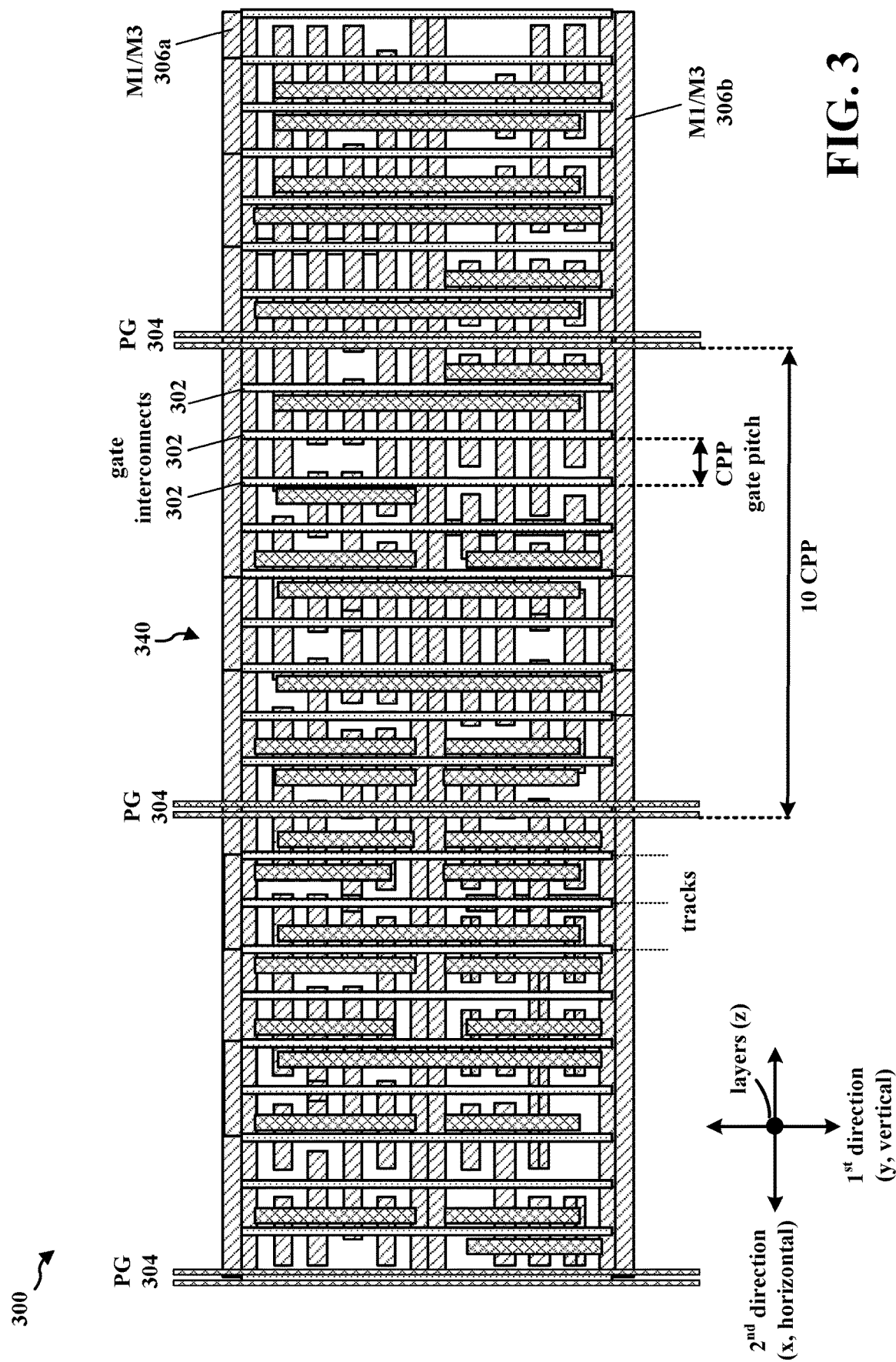
FIG. 3 is a first diagram conceptually illustrating a first standard cell architecture.
Figure 4:
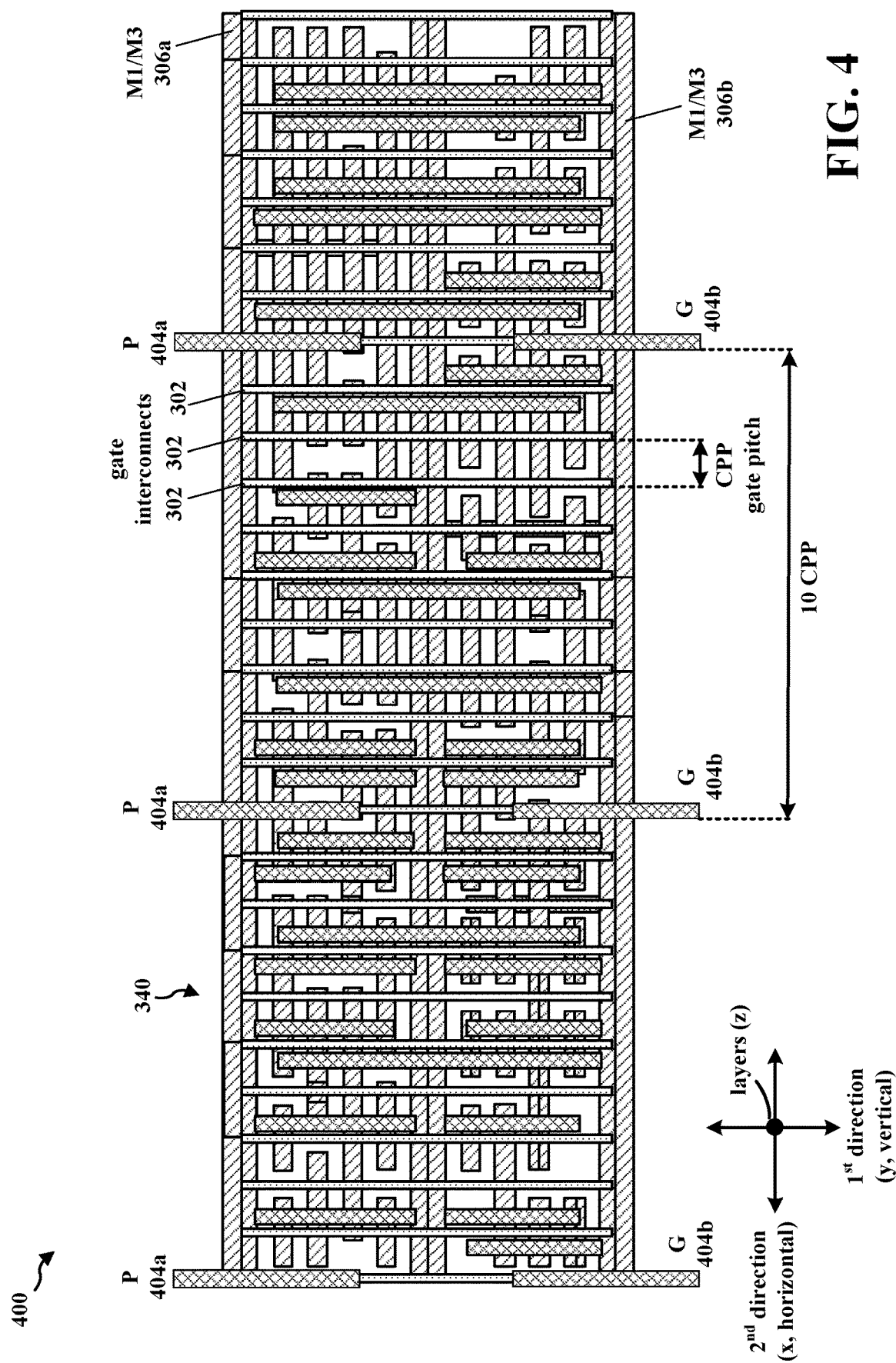
FIG. 4 is a second diagram conceptually illustrating a first standard cell architecture.

FIG. 3 is a first diagram 300 conceptually illustrating a first standard cell architecture. FIG. 4 is a second diagram 400 conceptually illustrating the first standard cell architecture. As illustrated in FIGS. 3, 4, an IC includes one or more logic cells 340 and a power grid 304, 404a, 404b, 306a, 306b. The power grid 304, 404a, 404b, 306a, 306b is a PG grid in a crossed pattern of a plurality of horizontally extending PG M1/M3 layer interconnects 306a, 306b and other parallel PG M1/M3 layer interconnects, and a plurality of vertically extending PG M2 layer interconnects 304, 404a, 404b and other parallel PG M2 layer interconnects. The logic cells 340 include gate interconnects 302 that extend on tracks in the first direction, where the tracks have the same gate pitch referred to as a contacted POLY pitch (CPP). The power grid includes PG M1/M3 layer interconnects 306a, 306b that extend horizontally in the second direction, and PG M2 layer interconnects 304 (see FIG. 3) or PG M2 layer interconnects 404a, 404b (see FIG. 4) that extend vertically in the first direction. In one example, the M1/M3 layer interconnects 306a may be coupled to power Vdd (i.e., voltage Vdd) and the M1/M3 layer interconnects 306b may be coupled to ground Vss (i.e., voltage Vss). The vertical PG M2 layer interconnects may either be dual PG M2 layer interconnects 304, as illustrated in FIG. 3, or separated PG M2 layer interconnects 404a, 404b, as illustrated in FIG. 4. In FIG. 3, the PG M2 layer interconnects 304 may include a first interconnect coupled to power Vdd and a second interconnect coupled to ground Vss. In FIG. 4, the PG M2 layer interconnects 404a may be coupled to power Vdd through higher layers of the power grid, and the PG M2 layer interconnects 404b may be coupled to ground Vss through higher layers of the power grid. The PG M2 layer interconnects 404a, 404b are collinear, and are separated in the center portion of the logic cells 340. Both the PG M2 layer interconnects 304 and the PG M2 layer interconnects 404a, 404b may have a regular pitch of 10 CPP.

As illustrated in FIGS. 3, 4, gate interconnects 302 within logic cells 340 may include three base metal layers, an M1 layer, an M2 layer, and an M3 layer. M1 layer interconnects on the M1 layer and M3 layer interconnects on the M3 layer may extend horizontally (second direction) and may have dedicated tracks for the power rails 306a, 306b. As cells may have the same M1/M3 power rails, M1/M3 may be cell placement independent. However, vertical M2 tracks may be shared between intra-cell M2 layer interconnects and the PG M2 layer interconnects 304 (FIG. 3) or 404a, 404b (FIG. 4). A cell that has a width of greater than 10 CPP may have vacant M2 tracks with a pitch of 10 CPP so that the cell may be placed within the PG M2 layer interconnects 304 (FIG. 3) or 404a, 404b (FIG. 4), with the vacant M2 tracks lined up with the PG M2 layer interconnects 304 (FIG. 3) or 404a, 404b (FIG. 4). FIGS. 5A, 5B, 6A, 6B provide further description in association with cell placement based on the first standard cell architecture.

Figure 5B:
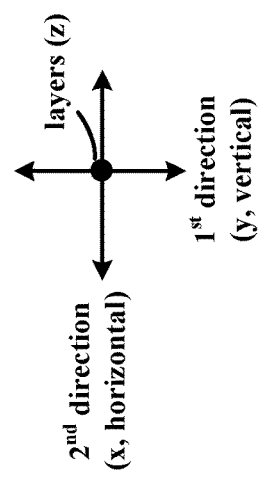
FIG. 5A and FIG. 5B are diagrams conceptually illustrating cell placement based on the first standard cell architecture.
Figure 5B:
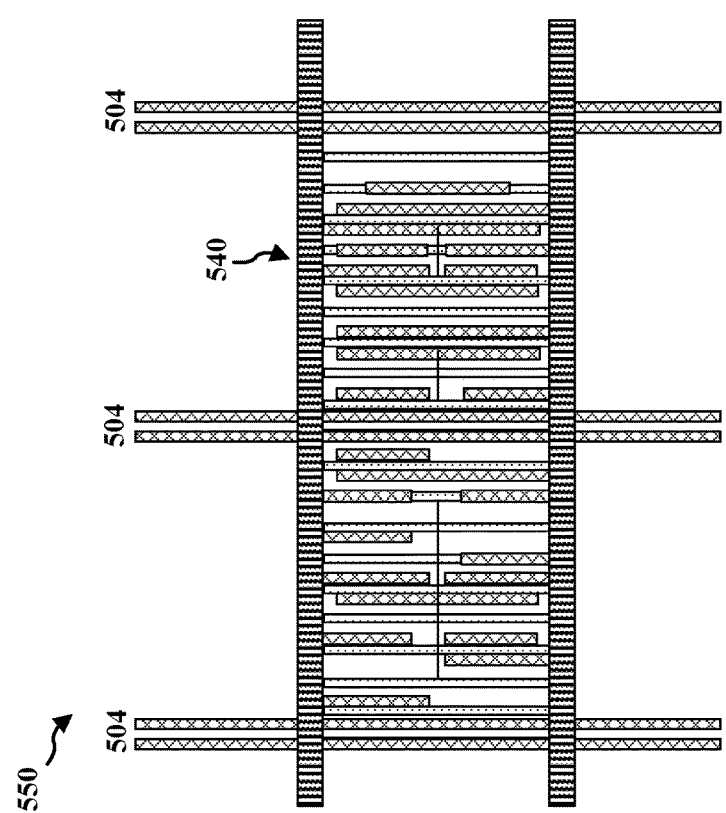
Figure 5A:
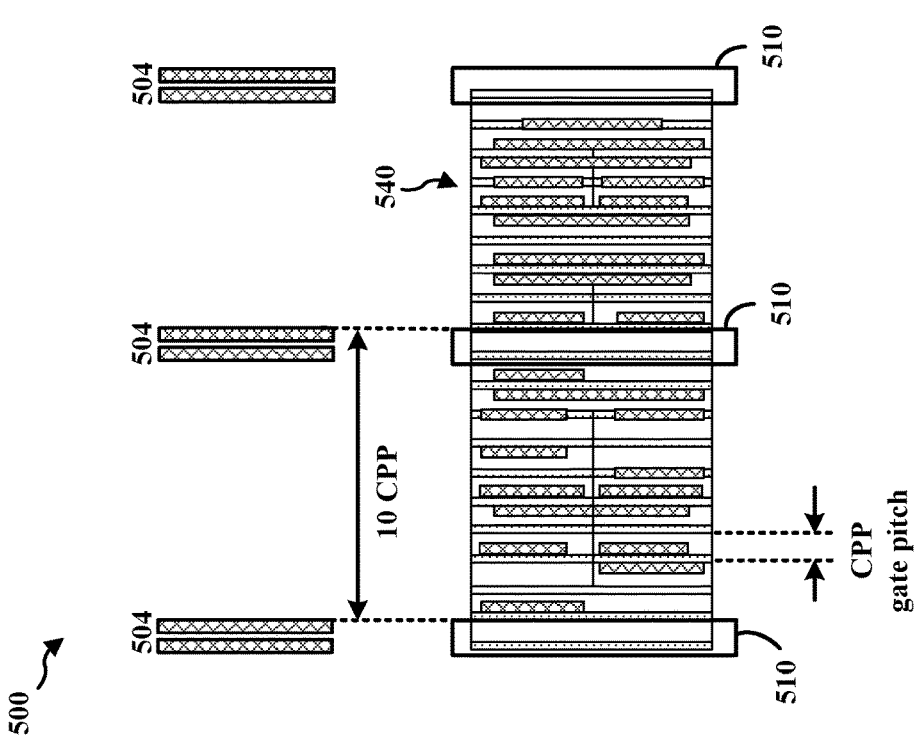

FIG. 5A and FIG. 5B are diagrams 500, 550 conceptually illustrating cell placement based on the first standard cell architecture. FIG. 6A and FIG. 6B are diagrams 600, 650 conceptually illustrating cell placement and PG density based on the first standard cell architecture. As illustrated in FIG. 5A, PG M2 504 may be pre-placed with a regular pitch of 10 CPP. The logic cells 540 are designed with vertical M2 vacancies 510 at a pitch of 10 CPP, and as illustrated in FIG. 5B, such logic cells 540 are placed within the PG M2 504 so that the M2 vacancies 510 within the logic cells 540 line up with the PG M2 504. Placement of such logic cells 540 are limited. For example, referring to FIG. 6A, if one logic cell 540 has a width of greater than 10 CPP and less than 20 CPP, and that logic cell 540 has only one M2 vacancy, there is only one position with respect to the PG M2 504 in which the cell can be placed (i.e., the logic cell 540 may only be shifted by 10x CPP within the IC, where x is an integer). Referring to FIG. 6B, denser PG M2 than the pre-determined 10 CPP pitch is not possible once cells are drawn with a given M2 PG pitch. That is, as the logic cell 540 has an M2 vacancy 510 with a pitch of 10 CPP, which is the same as the PG M2 pitch, there are no M2 vacancies to run addition PG M2 530 (represented by an X on the PG interconnects 530).

As cell design and vertical M2 pitch may be fixed to a given specification, cell placement may be limited to a certain combination. The cell placement grid may be limited to the M2 PG pitch. Dense M2 PG for high performance applications may not be possible. If the M2 PG pitch is denser to allow for high performance applications, logic cell area may be impacted by providing too many M2 vacancies within logic cells. To address the issues with the first standard cell architecture, a second standard cell architecture is provided below with respect to FIGS. 7A, 7B, 8A, 8B.

FIG. 7A and FIG. 7B are diagrams 700, 750 conceptually illustrating a second standard cell architecture, and cell placement based on the second standard cell architecture. FIG. 8A and FIG. 8B are diagrams 800, 850 conceptually illustrating cell placement and PG density based on the second standard cell architecture. As illustrated in FIG. 7A, on an IC, PG M2 704 may be pre-placed with a regular pitch $P_{PG}$ and track count (for example, $P_{PG}$ may be equal to 10 CPP). Standard logic cells may be designed with vertical gate interconnects 702 that extend on tracks (see tracks 1, 2, . . . , 16), horizontal M1 layer interconnects 760b, and vertical M2 layer interconnects 760a. Within such standard logic cells, every $m^{th}$ M2 track 710 may be reserved for a potential M2 PG, where $2 \leq m < P_{PG}$. The tracks correspond to the gate interconnects 702 in the standard logic cell. To reserve a track, standard logic cells are designed without an M2 layer interconnect 760a along the track. In one example, m=2 and every other CPP is reserved for a potential M2 PG.

In another example, m=3 and every third CPP is reserved for a potential M2 PG. In yet another example, the PG M2 704 may have a pitch of $P_{PG}$, and the M2 track vacancies 710 may have a pitch m, where $2 \leq m < P_{PG}$. As illustrated in FIGS. 7A, 7B, 8A, 8B, $P_{PG}$=10, but $P_{PG}$ may also be greater than or less than 10. In each of these examples, the pitch of the M2 track vacancies 710 is less than the pitch $P_{PG}$ of the regular PG M2 704.

As illustrated in FIG. 7B, logic cells 740 may be placed in avoidance of the M2 PG 704. Referring to FIG. 8A, with every $m^{th}$ M2 track reserved for a potential M2 PG, logic cells 740 may be placed within the M2 PG in different locations, with a possible shift to the right/left by x*m CPP, where x is an integer. For example, with m=2 (illustrated in FIGS. 7A, 7B, 8A, 8B), logic cells 740 may be placed within the M2 PG in different locations, with a possible shift to the right/left by two CPP. Referring to FIG. 8B, denser M2 PG for high performance is possible, as after the logic cells 740 are placed, additional PG M2 730 can be placed in the M2 track vacancies 710 not utilized by the regular PG M2 704. M2 PG density can therefore be increased up to a density of 1/m of the vertical M2 tracks.

Referring again to FIGS. 7A, 7B, 8A, 8B, a MOS IC logic cell 740 includes a plurality of gate interconnects 702 extending on tracks in a first direction. The logic cell 740 further includes intra-cell routing interconnects 760a, 760b coupled to at least a subset of the gate interconnects 702. The intra-cell routing interconnects 760a, 760b are connected only within the logic cell 740, and provide only internal connections within the logic cell 740. The intra-cell routing interconnects 760a, 760b include intra-cell metal x (Mx) layer interconnects 760a on an Mx layer extending in the first direction. The Mx layer may be a lowest metal layer for PG extending in the first direction. The intra-cell Mx layer interconnects 760a extend in the first direction over at least a subset of the tracks excluding every $m^{th}$ track (corresponding to the M2 track vacancies 710), where m is an integer greater than or equal to 2 and less than $P_{PG}$, and $P_{PG}$ is a PG grid pitch. In one example, $P_{PG}$ is equal to 10.

The plurality of gate interconnects 702 may include n gate interconnects. The intra-cell Mx layer interconnects 760a may not extend over any portion of every other $m^{th}$ track (corresponding to the M2 track vacancies 710). In one example, the intra-cell Mx layer interconnects 760a do not extend over any portion of an k+i*m track for i=0, 1, . . . , j, where k is an integer, and j is a largest integer such that k+j*m is less than or equal to n (where n is the number of gate interconnects 702 and the number of tracks (which correspond to the gate interconnects 702)). For example, referring to FIG. 7A, if k=1 and m=2, intra-cell Mx layer interconnects 760a do not extend over any portion of tracks 1, 3, 5, . . . , 15. In one example, m is an integer less than or equal to 3. In another example, m is equal to 2, and the intra-cell Mx layer interconnects 760a do not extend over any portion of every other gate interconnect 702 (on the odd numbered tracks 1, 3, 5, . . . , 15 of FIG. 7A) of the plurality of gate interconnects 702. In one example, the Mx layer is an M2 layer. The tracks may be separated by a pitch P. In such case, the aforementioned CPP is equal to P. The intra-cell Mx layer interconnects 760a may be unidirectional in the first direction. The intra-cell routing interconnects 760a, 760b may further include intra-cell metal x−1 (Mx−1) layer interconnects 760b on an Mx−1 layer extending in a second direction orthogonal to the first direction. The Mx−1 layer may be an M1 layer, and the Mx−1 layer interconnects 760b may be unidirectional in the second direction. As such, the M1 layer may be unidirectional in the second direction, the M2 layer may be unidirectional in the first direction, and vacancies may be reserved on the M2 layer for every $m^{th}$ track, where the M2 layer is a lowest vertical layer.

Referring again to FIGS. 7A, 7B, 8A, 8B, a MOS IC may include at least one logic cell 740. Each logic cell of the at least one logic cell 740 may include a plurality of gate interconnects 702 extending on tracks in a first direction with a pitch P (see FIG. 7A), and intra-cell routing interconnects 760a, 760b coupled to at least a subset of the gate interconnects 702. The intra-cell routing interconnects 760a, 760b include intra-cell Mx layer interconnects 760a on an Mx layer extending in the first direction. The Mx layer may be a lowest metal layer for PG extending in the first direction. The intra-cell Mx layer interconnects 760a may extend in the first direction over at least a subset of the tracks excluding every $m^{th}$ track (corresponding to the M2 track vacancies 710), where m is an integer greater than or equal to 2 and less than $P_{PG}$ (e.g., $P_{PG}$ may be equal to 10). The MOS IC may further include a first set of PG Mx layer interconnects 704 extending in the first direction over the at least one logic cell 740. The first set of PG Mx layer interconnects 704 may have a pitch $P_{PG}$ of greater than m*P (e.g., 10P=10 CPP).

The MOS IC may further include at least one of inter-cell Mx layer interconnects 770 or a second set of PG Mx layer interconnects 730 extending in the first direction over the at least one logic cell 740 (see FIG. 8B). Inter-cell Mx layer interconnects 770 are inter-cell routing interconnects for connecting different logic cells together, and are not used for any internal connections of any of the logic cells on the IC. The at least one of the inter-cell Mx layer interconnects 770 or the second set of PG Mx layer interconnects 730 are uncoupled to the intra-cell routing interconnects 760a, 760b of each logic cell of the at least one logic cell 740. The at least one of the inter-cell Mx layer interconnects 770 or the second set of PG Mx layer interconnects 730 extend on at least a subset of every $m^{th}$ track of each logic cell of the at least one logic cell 740 (corresponding to at least a subset of the M2 track vacancies 710).

The plurality of gate interconnects 702 may include n gate interconnects. The intra-cell Mx layer interconnects may not extend over any portion of every other $m^{th}$ track. As discussed above, the intra-cell Mx layer interconnects 760a may not extend over any portion of an k+i*m track for i=0, 1, . . . , j, where k is an integer, and j is a largest integer such that k+j*m is less than or equal to n. In one example, m is an integer less than or equal to 3. In one example, m is equal to 2, and in each logic cell, the intra-cell Mx layer interconnects 760a may not extend over any portion of every other gate interconnect 702 (on the odd numbered tracks 1, 3, 5, . . . , 15 of FIG. 7A) of the plurality of gate interconnects 702. The Mx layer may be an M2 layer. The first set of PG Mx layer interconnects 704 may have a pitch of greater than or equal to 10*P (i.e., 10 CPP). The Mx layer interconnects 760a may be unidirectional in the first direction. The intra-cell routing interconnects 760a, 760b may further include intra-cell Mx−1 layer interconnects 760b on an Mx−1 layer extending in a second direction orthogonal to the first direction. The Mx−1 layer may be an M1 layer. The Mx−1 layer interconnects 760b may be unidirectional in the second direction. As such, the M1 layer may be unidirectional in the second direction, the M2 layer may be unidirectional in the first direction, and vacancies may be reserved on the M2 layer for every $m^{th}$ track, where the M2 layer is a lowest vertical layer.

FIG. 9A and FIG. 9B are diagrams conceptually illustrating cell placement based on the first and second standard cell architectures, respectively. Referring to FIG. 9A, vertical M2 PG 904a and cell placement regions are likely to be separated. Cell width is restricted, unless cells 940a are designed with M2 track vacancies, such as at 902. With a pitch for the M2 track vacancies equal to the pitch $P_{PG}$ of the vertical M2 PG 904a, cells may be placed within the vertical M2 PG 904a, but their placement can be limited, and accordingly, there may be significant gaps 960 between cells. As such, through the first standard cell architecture, logic cells 940a may be designed to be more compact (less wide) than under the second standard cell architecture, but the IC 900 including the logic cells 940a may be less compact due to the logic cell placement limitations. Referring to FIG. 9B, vertical M2 PG 904b and cell M2 design may be decoupled, allowing more freedom in the placement of the logic cells 940b.

While the logic cells 940b may be less compact (wider) than the logic cells 940a through the first standard cell architecture, the IC 950 including the logic cells 940b may be more compact (i.e., as a result of less gaps between the logic cells 940b on the IC 950) than the IC 900 due to the logic cell placement flexibility. Further, through the second standard cell architecture (FIGS. 7A, 7B, 8A, 8B) as compared to the first standard cell architecture (FIGS. 5A, 5B, 6A, 6B), there is more flexibility in placing inter-cell M2 layer interconnects (e.g., 770 of FIG. 8B) and in placing additional PG M2 layer interconnects (e.g., 730 of FIG. 8B), which would make the power grid denser.

An MOS IC logic cell and MOS IC design will now be discussed. In a first step, MOS IC logic cells may be designed to include a plurality of gate interconnects extending on tracks in a first direction, and intra-cell routing interconnects coupled to at least a subset of the gate interconnects. The intra-cell routing interconnects include intra-cell Mx layer interconnects on an Mx layer extending in the first direction. The Mx layer is a lowest metal layer for PG extending in the first direction. The intra-cell Mx layer interconnects extend in the first direction over at least a subset of the tracks excluding every $m^{th}$ track, where m is an integer greater than or equal to 2 and less than $P_{PG}$, and $P_{PG}$ is a PG grid pitch. By excluding M2 layer interconnects from every $m^{th}$ track, the standard cell designer provides M2 vacancies for allowing for more flexibility in placing the standard MOS IC logic cell within an MOS IC.

In a second step, the MOS IC power grid is placed, where vertically extending PG M2 layer interconnects have a pitch of $P_{PG}$. The vertically extending PG M2 layer interconnects are referred to as a first set of PG Mx layer interconnects extending in the first direction over the at least one logic cell, where the first set of PG Mx layer interconnects have the pitch $P_{PG}$ that is greater than m*P.

In a third step, the MOS IC logic cells are placed in the IC, within the power grid including the vertically extending PG M2 layer interconnects. Because the MOS IC logic cells have additional M2 vacancies, there is more flexibility in placing the MOS IC logic cells within the PG M2 layer interconnects forming a part of the power grid on the IC.

In a fourth step, if there are additional M2 vacancies within the MOS IC logic cells that have not been filled by the power grid including the vertically extending PG M2 layer interconnects, the designer may route inter-cell M2 layer interconnects that connect different MOS IC logic cells to each other. The inter-cell M2 layer interconnects are referred to as at least one of inter-cell Mx layer interconnects that extend in the first direction over the at least one logic cell. The at least one of the inter-cell Mx layer interconnects is uncoupled to the intra-cell routing interconnects of each logic cell of the at least one logic cell. The at least one of the inter-cell Mx layer interconnects extends on at least a subset of the every $m^{th}$ track of each logic cell of the at least one logic cell.

In a fifth step, if there are still additional M2 vacancies within the MOS IC logic cells, the designer may route additional PG M2 layer interconnects to make the power grid denser. The additional PG M2 layer interconnects are referred to as a second set of PG Mx layer interconnects that extends in the first direction over the at least one logic cell. The second set of PG Mx layer interconnects is uncoupled to the intra-cell routing interconnects of each logic cell of the at least one logic cell. The second set of PG Mx layer interconnects extends on at least a subset of the every $m^{th}$ track of each logic cell of the at least one logic cell.

The architecture, as discussed above, provides advantages over the first standard cell architecture by (1) providing more freedom in the placement of the MOS IC logic cells, (2) providing more freedom in the placement of inter-cell routing interconnects connecting different MOS IC logic cells to each other, and (3) providing more flexibility in increasing the density of the power grid by placing additional vertical PG interconnects. With respect to (1), the second standard cell architecture allows more freedom in the placement of the MOS IC logic cells. While the MOS IC logic cells may be less compact (wider) than the MOS IC logic cells through the first standard cell architecture, the IC including the MOS IC logic cells of the second standard cell architecture may be more compact (i.e., as a result of less gaps between the MOS IC logic cells on the IC) than the MOS IC logic cells on the IC designed based on the first standard cell architecture due to the logic cell placement flexibility.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other embodiments or teachings described herein, without limitation.

Example 1 is a MOS IC logic cell including a plurality of gate interconnects extending on tracks in a first direction; and intra-cell routing interconnects coupled to at least a subset of the gate interconnects, the intra-cell routing interconnects including intra-cell Mx layer interconnects on an Mx layer extending in the first direction. The Mx layer is a lowest metal layer for PG extending in the first direction. The intra-cell Mx layer interconnects extend in the first direction over at least a subset of the tracks excluding every $m^{th}$ track, where m is an integer greater than or equal to 2 and less than $P_{PG}$, and $P_{PG}$ is a PG grid pitch.

Example 2 is the MOS IC logic cell of example 1, wherein the plurality of gate interconnects include n gate interconnects, where n is an integer, and the intra-cell Mx layer interconnects do not extend over any portion of every other $m^{th}$ track.

Example 3 is the MOS IC logic cell of example 2, wherein the intra-cell Mx layer interconnects do not extend over any portion of an k+i*m track for i=0, 1, . . . , j, where k is an integer, and j is a largest integer such that k+j*m is less than or equal to n.

Example 4 is the MOS IC logic cell of any of examples 1 to 3, wherein m is an integer less than or equal to 3.

Example 5 is the MOS IC logic cell of example 4, wherein m is equal to 2, and the intra-cell Mx layer interconnects do not extend over any portion of every other gate interconnect of the plurality of gate interconnects.

Example 6 is the MOS IC logic cell of any of examples 1 to 5, wherein the Mx layer is an M2 layer.

Example 7 is the MOS IC logic cell of any of examples 1 to 6, wherein the tracks are separated by a pitch P.

Example 8 is the MOS IC logic cell of any of examples 1 to 7, wherein the intra-cell Mx layer interconnects are unidirectional in the first direction.

Example 9 is the MOS IC logic cell of any of examples 1 to 8, wherein the intra-cell routing interconnects further include intra-cell Mx−1 layer interconnects on an Mx−1 layer extending in a second direction orthogonal to the first direction.

Example 10 is the MOS IC logic cell of example 9, wherein the Mx−1 layer is an M1 layer.

Example 11 is the MOS IC logic cell of any of examples 9 and 10, wherein the Mx−1 layer interconnects are unidirectional in the second direction.

Example 12 is the MOS IC logic cell of any of examples 1-11, wherein $P_{PG}$ is equal to 10.

Example 13 is a MOS IC including at least one logic cell. Each logic cell of the at least one logic cell includes a plurality of gate interconnects extending on tracks in a first direction with a pitch P, and intra-cell routing interconnects coupled to at least a subset of the gate interconnects. The intra-cell routing interconnects include intra-cell Mx layer interconnects on an Mx layer extending in the first direction. The Mx layer is a lowest metal layer for PG extending in the first direction. The intra-cell Mx layer interconnects extend in the first direction over at least a subset of the tracks excluding every $m^{th}$ track, where m is an integer greater than or equal to 2 and less than $P_{PG}$, and $P_{PG}$ is a PG grid pitch. The MOS IC further includes a first set of PG Mx layer interconnects extending in the first direction over the at least one logic cell. The first set of PG Mx layer interconnects have the pitch $P_{PG}$ that is greater than m*P.

Example 14 is a MOS IC of example 13, further comprising at least one of inter-cell Mx layer interconnects or a second set of PG Mx layer interconnects extending in the first direction over the at least one logic cell. The at least one of the inter-cell Mx layer interconnects or the second set of PG Mx layer interconnects are uncoupled to the intra-cell routing interconnects of each logic cell of the at least one logic cell. The at least one of the inter-cell Mx layer interconnects or the second set of PG Mx layer interconnects extend on at least a subset of the every $m^{th}$ track of each logic cell of the at least one logic cell.

Example 15 is a MOC IC of any of examples 13 and 14, wherein the plurality of gate interconnects include n gate interconnects, where n is an integer, and the intra-cell Mx layer interconnects do not extend over any portion of every other $m^{th}$ track.

Example 16 is a MOS IC of example 15, wherein the intra-cell Mx layer interconnects do not extend over any portion of an k+i*m track for i=0, 1, . . . , j, where k is an integer, and j is a largest integer such that k+j*m is less than or equal to n.

Example 17 is a MOS IC of any of examples 13 to 16, wherein m is an integer less than or equal to 3.

Example 18 is a MOS IC of any of examples 13 to 17, wherein m is equal to 2, and in each logic cell, the intra-cell Mx layer interconnects do not extend over any portion of every other gate interconnect of the plurality of gate interconnects.

Example 19 is a MOS IC of any of examples 13 to 18, wherein the Mx layer is an M2 layer.

Example 20 is a MOS IC of any of examples 13 to 19, wherein the pitch $P_{PG}$ of the first set of PG Mx layer interconnects is greater than or equal to 10*P.

Example 21 is a MOS IC of any of examples 13 to 20, wherein the intra-cell Mx layer interconnects are unidirectional in the first direction.

Example 22 is a MOS IC of any of examples 13 to 21, wherein the intra-cell routing interconnects further include intra-cell Mx−1 layer interconnects on an Mx−1 layer extending in a second direction orthogonal to the first direction.

Example 23 is a MOS IC of example 22, wherein the Mx−1 layer is an M1 layer.

Example 24 is a MOS IC of any of examples 22 and 23, wherein the Mx−1 layer interconnects are unidirectional in the second direction.

Example 25 is a MOS IC of any of examples 12-24, wherein $P_{PG}$ is equal to 10.

What is claimed is:

1. A metal oxide semiconductor (MOS) integrated circuit (IC) logic cell, comprising:
   a plurality of gate interconnects extending on tracks in a first direction orthogonal to a second direction; and
   intra-cell routing interconnects coupled to at least a subset of the gate interconnects, the intra-cell routing interconnects including intra-cell metal x (Mx) layer interconnects on an Mx layer extending in the first direction, the Mx layer being a lowest first direction metal layer for power and ground (PG) that also extends in the first direction, the intra-cell Mx layer interconnects extending in the first direction over at least a subset of the tracks excluding every $m^{th}$ track, where m is an integer greater than or equal to 2 and less than $P_{PG}$, and $P_{PG}$ is a PG grid pitch.

2. The MOS IC logic cell of claim 1, wherein the plurality of gate interconnects include n gate interconnects, where n is an integer, and the intra-cell Mx layer interconnects do not extend over any portion of every other $m^{th}$ track.

3. The MOS IC logic cell of claim 2, wherein the intra-cell Mx layer interconnects do not extend over any portion of an k+i*m track for i=0, 1, . . . , j, where k is an integer, and j is a largest integer such that k+j*m is less than or equal to n.

4. The MOS IC logic cell of claim 1, wherein m is an integer less than or equal to 3.

5. The MOS IC logic cell of claim 4, wherein m is equal to 2, and the intra-cell Mx layer interconnects do not extend over any portion of every other gate interconnect of the plurality of gate interconnects.

6. The MOS IC logic cell of claim 1, wherein the Mx layer is an M2 layer.

7. The MOS IC logic cell of claim 1, wherein the tracks are separated by a pitch P.

8. The MOS IC logic cell of claim 1, wherein the intra-cell Mx layer interconnects are unidirectional in the first direction.

9. The MOS IC logic cell of claim 1, wherein the intra-cell routing interconnects further include intra-cell metal x−1 (Mx−1) layer interconnects on an Mx−1 layer extending in the second direction.

10. The MOS IC logic cell of claim 9, wherein the Mx−1 layer is an M1 layer.

11. The MOS IC logic cell of claim 9, wherein the Mx−1 layer interconnects are unidirectional in the second direction.

12. The MOS IC logic cell of claim 1, wherein $P_{PG}$ is equal to 10.

* * * * *